(12) United States Patent
Ackerman et al.

(10) Patent No.: US 6,384,963 B2
(45) Date of Patent: May 7, 2002

(54) OPTICAL COMMUNICATION SYSTEM WITH CO-PROPAGATING PUMP RADIATION FOR RAMAN AMPLIFICATION

(75) Inventors: David Ackerman, Hopewell, NJ (US); Kenneth L. Bacher, Macungie; William Dautremont-Smith, Orefield, both of PA (US); Mei Du, Scotch Plains, NJ (US); Karsten Rottwitt, Basking Ridge, NJ (US); Andrew John Stentz, Clinton, NJ (US); Thomas A. Strasser, Warren, NJ (US); Liming Zhang, Marlboro, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/769,083

(22) Filed: Jan. 25, 2001

Related U.S. Application Data

(60) Provisional application No. 60/186,797, filed on Mar. 3, 2000.

(51) Int. Cl.[7] ............................. H01S 3/00; H04B 10/12

(52) U.S. Cl. ..................... 359/334; 359/341.3; 359/337

(58) Field of Search .............................. 359/334, 341.3, 359/337; 372/6

(56) References Cited

U.S. PATENT DOCUMENTS

| | | | | |
|---|---|---|---|---|
| 4,881,790 A | * | 11/1989 | Mollenauer | 359/173 |
| 5,673,280 A | * | 9/1997 | Grubb et al. | 372/3 |
| 5,847,862 A | * | 12/1998 | Chraplyvy et al. | 359/164 |

(List continued on next page.)

OTHER PUBLICATIONS

Kao, M.–S. and Wu, J. "Signal Light Amplification by Stimulated Raman Scattering in an N–Channel WDM Optical Fiber Communication System." J. Lightwave Tech. 7:9, Sep. 1989. pp. 1290–1299.*
Jiang, W. and Ye, P. "Crosstalk in Fiber Raman Amplificaitn for WDm Systems." J. Lightwave Tech. 7:9, Sep. 1989. pp. 1407–1411.*
Kidorf, H. et al. "Pump interactions in a 100–nm Bandwidth Raman Amplifier." IEEE Photonics Tech. Lett. 11:5, May 1999. pp. 530–532.*
Nissov, M. et al. "Raleigh crosstalk in long cascades of distributed unsaturated Raman amplifiers." Elect. Lett. 35:12, Jun. 1999. pp. 997–998.*
Wentworth, R.H. et al. "Laser Mode Partition Noise in Lightwave Systems Using Dispersive Optical Fiber." J. Lightwave Tech. 10:1, Jan. 1992. pp. 84–89.*
Wey, J.S. et al. "Cross–talk Bandwidth in Backward Pumped Fiber Raman Amplifiers." pp. 50–52, paper, FC1–1. OFC/IOO '99 Technical Digest.*
Aoki, Y. "Properties o fFiber Raman Amplifiers and Their Applicability to Digital Optical Communication Systems." J. Lightwave Tech. 6:7, Jul. 1988, pp. 1225–1239.*

Primary Examiner—Thomas H. Tarcza
Assistant Examiner—Andrew R Sommer
(74) Attorney, Agent, or Firm—Wendy W. Koba Esq.

(57) ABSTRACT

A fiber Raman amplifier is configured to use a co-propagating Raman pump source, which may be beneficial in a variety of system configurations (for example, in bidirectional communication systems). By carefully configuring the pump source characteristics, sufficient optical gain can be achieved in the co-propagating arrangement, the characteristics including: (1) using an optical pump power of at least 50 mW, (2) having a relatively large spectral bandwidth within the pump (to suppress SBS); and (3) a frequency difference between all longitudinal pump modes of each pump laser being separated by at least the walk-off frequency between the pump laser frequency and the signal frequency, and all intense longitudinal modes between different pump lasers being separated by at least the electrical bandwidth of the communication system.

24 Claims, 5 Drawing Sheets

U.S. PATENT DOCUMENTS 5,946,428 A * 8/1999 Aleksandrov et al. ... 359/341.3
6,115,174 A * 9/2000 Grubb et al. ............... 359/334
6,147,794 A * 11/2000 Stentz ....................... 359/124
6,191,877 B1 * 2/2001 Chraplyvy et al. ......... 359/124
6,282,002 B1 * 8/2001 Grubb et al. ............... 359/134
6,304,368 B1 * 10/2001 Hansen et al. .............. 359/134
6,335,820 B1 * 1/2002 Islam ......................... 359/334

* cited by examiner

OPTICAL COMMUNICATION SYSTEM WITH CO-PROPAGATING PUMP RADIATION FOR RAMAN AMPLIFICATION

CROSS-REFERENCE TO RELATED APPLICATION

This application claims the priority of Provisional Application No. 60/186,797, filed Mar. 3, 2000.

TECHNICAL FIELD

The present invention relates to a Raman amplified optical communication system and, more particularly, to an optical communication system utilizing co-propagating Raman amplification with Raman pump sources particularly designed to overcome known pump-signal crosstalk problems.

BACKGROUND OF THE INVENTION

The subject of Raman amplification is well known in the literature. Stimulated Raman amplification is a nonlinear optical process in which an intense pump wave is injected into an optical fiber that is carrying one or more optical signals. In fused silica fibers, if the pump wave is of a frequency approximately 13 THz greater than the signal waves (i.e., if the pump wavelength is approximately 100 nm shorter than the signal wavelength in the vicinity of 1500 nm), the pump will amplify the signal(s) via stimulated Raman scattering. If the amplification is made to occur in the transmission fiber itself, the amplifier is referred to as a "distributed amplifier". Such distributed amplification has been found to improve the performance of a communication system, as discussed in the article "Capacity upgrades of transmission systems by Raman amplification" by P. Hansen et al. appearing in *IEEE Phot. Tech. Lett.,* Vol. 9, 1997, at page 262. For example, if a pump wave is injected into one end of the fiber in a direction that is counter-propagating with respect to the information signals, the signals will be amplified before their signal-to-noise ratio degrades to an unacceptable level. The performance of such an amplifier is often characterized in terms of its "effective" or "equivalent" noise figure and its on/off gain. The effective noise figure is defined as the noise figure that an equivalent post-amplifier would have in order to achieve the same noise performance as the distributed Raman amplifier (see, for example, "Rayleigh scattering limitations in distributed Raman pre-amplifiers", by P. Hansen et al., *IEEE Phot. Tech. Lett.* Vol. 10, 1998, at page 159). Experimentally, the effective noise figure may be found by measuring the noise figure of a span utilizing counter-propagating Raman amplification and then subtracting (in decibels) the passive loss of the span. The on/off gain of a distributed Raman amplifier is defined as the difference (in decibels) between the output signal power with the Raman pump "on" to that with the pump "off". Alternatively, a lumped or "discrete" amplifier can be constructed with a local length of Raman gain fiber.

It is well known in the prior art that Raman gain generated with a polarized pump wave is, in general, polarization dependent. This phenomenon is discussed in detail in an article entitled "Polarization effects in fiber Raman and Brilloiun lasers" by R. H. Stolen et al., appearing in *IEEE J. Quantum Electronics,* Vol. QE-15, 1979, at p. 1157. Given that the vast majority of fiber optic communication systems utilize non-polarization maintaining fibers, an optical signal's state of polarization at any given point is not generally known and is subject to capricious variations. For these reasons, it is desirable to minimize polarization-dependent loss and gain within the communication system. It has also been shown that the polarization dependence of Raman amplifiers can be significantly reduced by polarization multiplexing polarized Raman sources, as disclosed in U.S. Pat. No. 4,881,790, issued to L. F. Mollenauer et al. on Nov. 21, 1989.

Significant pump powers are required to generate substantial on/off Raman gain in conventional transmission fibers. For example, approximately 300 mW of power is required from a monochromatic pump to generate 15 dB of on/off Raman gain in transmission fibers with ~55 $\mu m^2$ effective areas. It is also known that these pump powers are significantly higher than the threshold for stimulated Brilloiun scattering (SBS) for pump sources with spectral widths less than 25 MHz, as discussed in the article "Optical Power Handling Capacity of Low Loss Optical Fibers as determined by Stimulated Raman and Brilloiun Scattering", by R. G. Smith, appearing in *Appl. Optics,* Vol. 11, 1972, at page 2489. Stimulated Brilloiun scattering is a well-known nonlinear optical process in which the pump light couples to an acoustic wave and is retro-reflected. This retro-reflection may prohibit the penetration of the Raman pump significantly deep into the transmission fiber, inhibiting the generation of Raman gain.

The threshold for SBS can be substantially increased by broadening the spectral width of the Raman pump source, as discussed in the above-cited Mollenauer et al. patent. In particular, one method for broadening the spectral width and thus suppressing SBS is by frequency dithering of the laser source. Another mechanism for broadening the spectral width of a laser is to allow the device to lase in more than one longitudinal mode of the laser cavity. The frequency spacing of the longitudinal modes of a laser is defined by the relation $c/2\ n_g L$, where c is the speed of light in a vacuum, $n_g$ is the group velocity within the laser cavity and L is the length of the cavity.

Certain types of semiconductor lasers are preferred for use as Raman pump sources. The most common types of semiconductor pump lasers are Fabry-Perot (FP) lasers, and FP lasers locked to external fiber Bragg gratings. These types of pump sources are discussed in an article entitled "Broadband lossless DCF using Raman amplification pumped by multichannel WDM laser diodes" by Emori et al. appearing in *Elec. Lett,* Vo. 34, 1998 at p. 2145. It is typical for the external fiber Bragg gratings to be located approximately 1 m from the semiconductor laser.

It is known that when light from a laser, lasing in multiple longitudinal modes, is passed through a dispersive delay line (such as an optical fiber), noise components referred to as mode partitioning noise are generated at frequencies typically less than a few GHz. See, for example, "Laser Mode Partitioning Noise in Lightwave Systems Using Dispersive Optical Fiber", by R. Wentworth et al., appearing in *J. of Lightwave Technology,* Vol. 10, No. 1, 1992 at pp. 84–89. It is also known that single-longitudinal-mode semiconductor lasers are typically used as signal sources. Common types are distributed feedback (DFB) lasers and distributed Bragg reflector (DBR) lasers.

The Raman amplification process is known as an extremely fast nonlinear optical process. For this reason, intensity fluctuations in the pump may result in fluctuations in the Raman gain. These gain fluctuations may then impress noise upon the optical signals, degrading the performance of the communication system. For the purposes of understanding the teaching of the present invention, this effect will be referred to as the "pump-signal crosstalk". It is known that, at sufficiently high frequencies, the signal and pump will "walk off" with respect to one another, due to dispersion within the fiber. It is also known that the use of a strictly counter-propagating pump geometry, that is, where the direction of propagation of all Raman pumps is opposite to that of all signals, is effective in reducing degradations from pump-signal crosstalk. This amplifier geometry is discussed in detail in an article entitled "Properties of Fiber Raman Amplifiers and their Applicability to Digital Optical Communication Systems" by Y. Aoki, appearing in *J. Lightwave Technology*, Vol. 6, No. 7, 1988 at pages 1225–29. In counter-propagating pump geometries, the transit time through the amplifying fiber is used to average the pump intensity fluctuations such that "quiet" amplification may be achieved. It is also known that the counter-propagating pump geometries serve to reduce the polarization dependence of the Raman gain.

Another potential source of noise in Raman amplified systems arises in systems transmitting information in multiple signal wavelengths, where the multiple signals will more quickly deplete the power in the Raman pump. See, for example, "Crosstalk in Fiber Raman Amplification for WDM Systems", W. Jiang et al., *J. of Lightwave Technology*, Vol. 7, No. 9, 1989 at pp. 1407–111. In this situation, the information imposed on one signal wavelength is impressed upon a signal at the same or a different wavelength via the Raman gain process. For the purposes of understanding the teaching of the present invention, this effect will be referred to as the "signal-pump-signal crosstalk". This source of noise is also greatly reduced in counter-propagating pump geometries where the transit time through the amplifying fiber is used to reduce the effects of any pump intensity fluctuations.

It is also known that due to unusual noise sources, such as pump-signal crosstalk and signal-pump-signal crosstalk, it is often necessary to characterize the noise performance of Raman amplifiers with electrical noise figure measurements, characterizing the effective noise figure as a function of electrical frequency.

There are potential system advantages to the use of co-propagating Raman amplification, including increasing the signal-to-noise ratios of the amplified signals, minimizing excursions of the signal powers as a function of length, and allowing for the bi-directional propagation of signals within the same distributed Raman amplifier. However, a problem with these co-propagating Raman amplifiers is that they are more susceptible to both pump-signal crosstalk and signal-pump-signal crosstalk.

An exemplary prior art co-propagating Raman amplifier arrangement is discussed in the article "Wide-Bandwidth and Long-Distance WDM Transmission using Highly Gain Flattened Hybrid Amplifiers" by S. Kawai et al., appearing in *IEEE Phot. Tech. Lett.*, Vol. 11, No. 7, 1999 at pp. 886–888. However, the on/off Raman gain of this particular configuration is exceedingly low (i.e., approximately 4 dB)—a region where the above-mentioned problems would be minimal.

Thus, a need remains for a co-propagation Raman amplification system that provides a sufficient on/off gain to be a useful device, while not exhibiting undesirable levels of pump-signal crosstalk and signal-pump-signal crosstalk.

SUMMARY OF THE INVENTION

The need remaining in the prior art is addressed by the present invention, which relates to Raman amplified optical communication system and, more particularly to an optical communication system utilizing co-propagating Raman amplification with Raman pump sources particularly designed to overcome pump-signal crosstalk problems in co-propagating systems.

In accordance with the present invention, an optimized Raman pump source is utilized that produces at least 50 mW of output power, sufficient spectral width to suppress SBS, and is configured such that the frequency difference between all intense longitudinal pump modes (regardless of polarization) are separated by at least the electrical bandwidth of the communication system, or at least the walk-off frequency, where "walk-off frequency" is defined as the lowest frequency at which the pump-signal crosstalk is no longer a significant factor in degrading the performance of the Raman amplifier.

In various embodiments, the pump source may comprise one or more frequency-dithered DFB lasers, multi-longitudinal mode DFB lasers, DBR lasers, frequency-offset FP lasers, or FP lasers locked to a Fabry-Perot fiber Bragg grating reflector.

In one embodiment of the present invention, the pump source may be injected into the input of dispersion-compensating fiber at the input of a discrete Raman amplifier to generate co-propagating Raman amplification, where the effects of both pump-signal crosstalk and signal-pump-signal crosstalk are minimized.

Advantageously, the pump sources of the present invention may be used in either a distributed Raman amplifier application or a discrete Raman amplifier application.

Other and further embodiments of the present invention will become apparent during the course of the following discussion and by reference to the accompanying drawings.

BRIEF DESCRIPTION OF THE DRAWINGS

Referring now to the drawings.

DETAILED DESCRIPTION

As discussed above, there are many significant differences in performance when comparing a Raman amplifier utilizing a counter-propagating pump source to a Raman amplifier utilizing a co-propagating pump source. The problems associated with co-pumped configurations need to be addressed, where one problem in particular—pump-signal crosstalk—is often not an issue in a counter-propagating arrangement since the signal has a transient time through the amplifier and the strong averaging effect reduces the crosstalk. However, in a co-pumping configuration, the signal and the pump travel together and the only averaging effect is the dispersive delay related to the walk-off between the pump and the signal.

Figure 1:
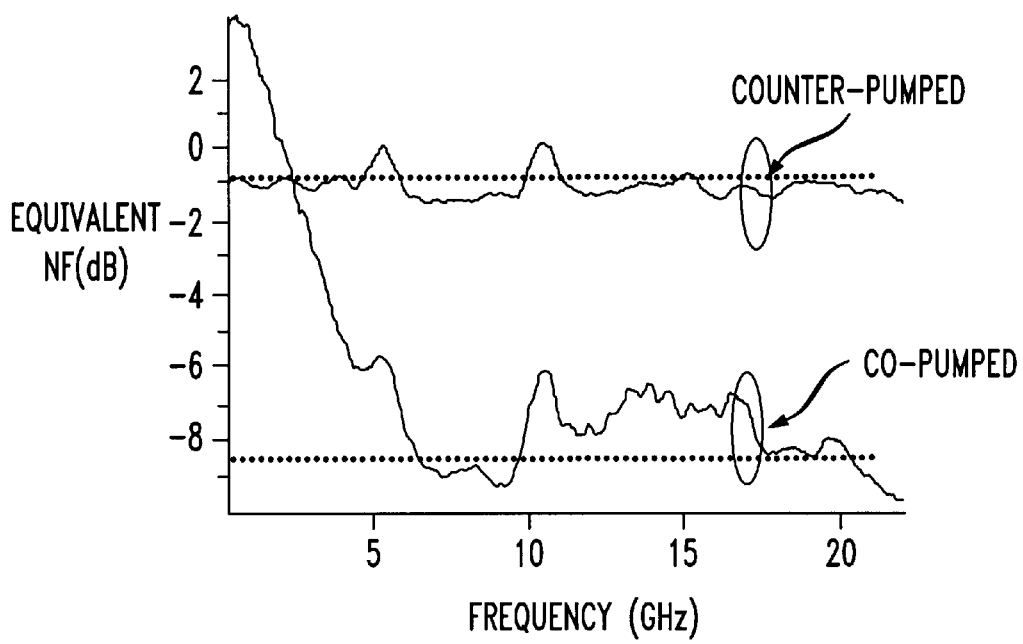
FIG. 1 contains plots of the electrical effective noise figure spectra of distributed Raman amplifiers pumped with conventional FP semiconductor pump lasers locked to fiber Bragg gratings in both co- and counter-propagating geometries, where the solid lines are experimentally measured and dashed lines are calculated values.

In the course of studying the pump-signal crosstalk problem in association with the present invention, it has been found that a first type of noise originates from the intrinsic amplitude noise of the pump. In particular and unlike the case for the counter-propagating geometry, the mode beating noise in the pump will couple to the signal in the forward (co-pumped) direction. This type of noise can degrade the signal-to-noise ratio (SNR), causing a power penalty in the co-pumped Raman amplifier configuration. FIG. 1 illustrates the electrical noise figure measurement, which is used to identify this noise contribution at different frequencies. That is, for the plots of FIG. 1, the electrical effective noise figure spectra of distributed Raman amplifiers pumped with conventional FP semiconductor pump lasers locked to fiber Bragg gratings was measured. The wavelength of the Raman pump was chosen to be 1450 nm and the wavelength of the optical signal was 1560 nm and an on/off Raman gain of 11.7 dB was achieved. The solid lines illustrate the experimentally measured values, while the dashed lines are theoretical values. In particular, the theoretical values are calculated based solely on noise from signal-spontaneous beating, that is, excluding all "excess" noise sources that will be discussed in detail hereinbelow in association with the teaching of the present invention. The theoretical value ignores noise from pump-signal crosstalk (i.e., presumes a "perfect" pump).

As shown, there is substantial agreement between the theoretical and measured values of the effective noise figure for the counter-propagating arrangement, supporting the theory that counter-pumping effectively eliminates pump-signal crosstalk. In contrast, as illustrated in FIG. 1, a significant deviation exists between the experimental results and the theoretical values for a co-propagating pump configuration, where this deviation is attributed to pump-signal crosstalk. As shown clearly in FIG. 1, pump-signal walk-off effectively averages this source of noise for frequencies greater than approximately 5 GHz (the value of 5 GHz being exemplary only and associated with this particular pump module, Raman gain and group velocity difference between the pump and signal; for other amplifiers the walk-off frequency may be as low as 1 GHz). For the purposes of understanding the teaching of the present invention, this frequency (above which the pump-signal crosstalk is no longer a significant factor in degrading the performance of the Raman amplifier) will be referred to as the "walk-off frequency". In particular, this frequency will depend on the relative group velocities of the pump and signal wavelengths in the gain fiber, as well as the magnitude of the Raman gain. Thus, an optical pump source suitable for use in a co-propagating geometry in accordance with the present invention should only exhibit longitudinal modes separated by at least the system walk-off frequency.

Figure 2:
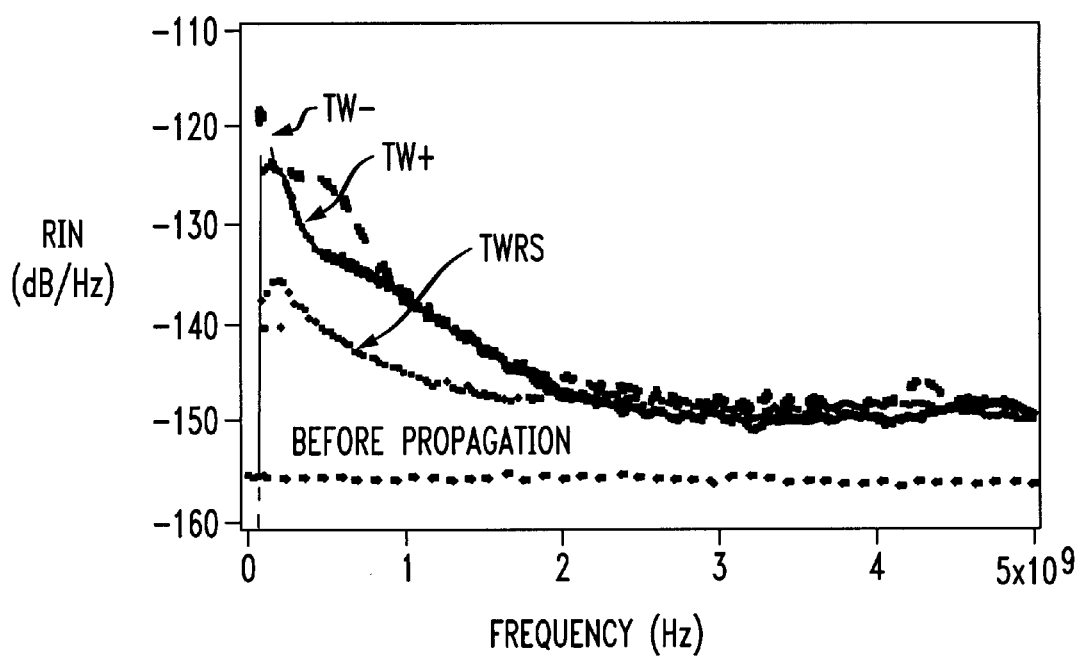
FIG. 2 contains plots of relative intensity noise (RIN) of the light from an FP semiconductor laser before and after propagating through approximately 40 km lengths of True-Wave Minus®, TrueWave Plus® and TrueWave Reduced Slope® fibers with group-velocity dispersions at pump wavelengths of −11.8, −5.2 and 0.8 ps/nm-km, respectively.

FIG. 2 contains plots of the relative intensity noise (RIN) of the light from a FP semiconductor laser before and after propagating through ~40 km of TrueWave Minus®, TrueWave Plus® and TrueWave Reduced Slope® fibers with group-velocity dispersions at the pump wavelengths of −11.8, −5.2 and 0.8 ps/nm-km, respectively. The low frequency noise is due to mode-partitioning noise. Referring to FIG. 2, it is shown that the noise is higher after propagation through fibers of higher dispersion. This source of noise will then be transferred to a co-propagating signal through Raman amplification. Heretofore, this noise source was not discovered and, therefore, problems associated with this high dispersion were not addressed.

Figure 3:
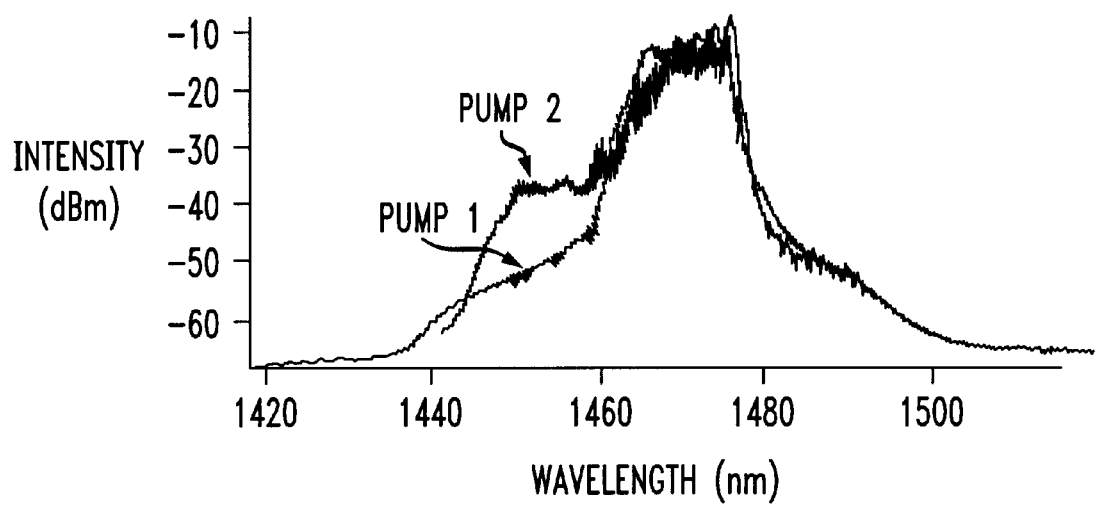
FIG. 3 contains plots of optical spectra generated from two FP semiconductor lasers that have been polarization multiplexed.
Figure 4:
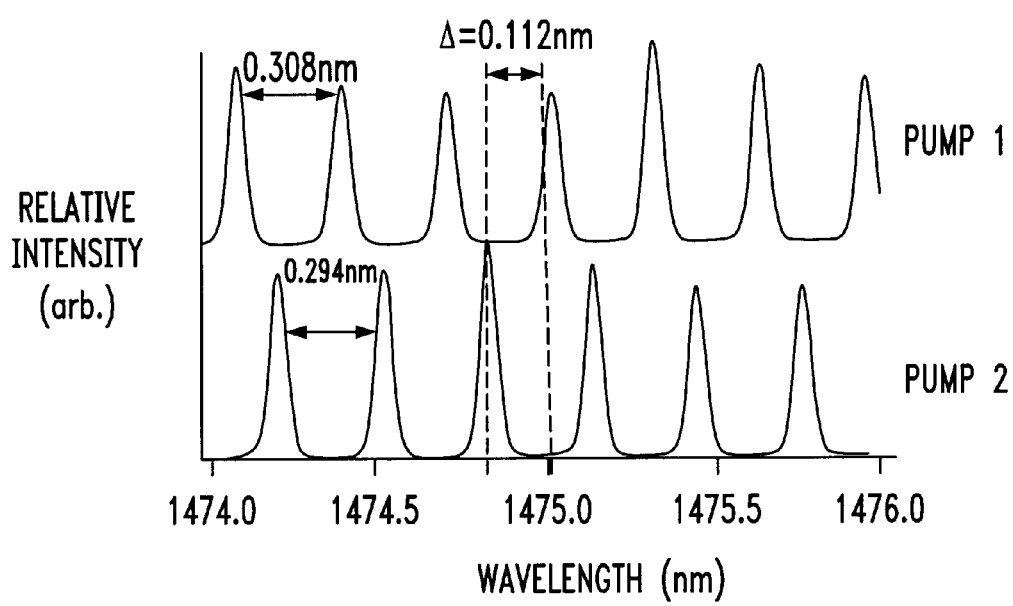
FIG. 4 contains higher resolution plots of the spectra of the longitudinal modes of the two FP semiconductor lasers of FIG. 3.

The plots of the optical spectra generated from two FP semiconductor pump lasers that have been polarization multiplexed, at a center wavelength of approximately 1470 nm, are shown in FIG. 3 and denoted as "Pump 1" and "Pump 2". The individual longitudinal modes cannot be distinguished in these plots. A higher resolution of these plots is contained in FIG. 4, where these plots show that the two FP lasers have slightly different longitudinal mode spacings such that there are inevitably wavelengths at which modes of the two lasers overlap. As the temperature of one of the diodes is increased, it has been found that the modes of the laser shift to longer wavelengths, thereby changing the relative spacing between various longitudinal modes of the two lasers.

Figure 5:
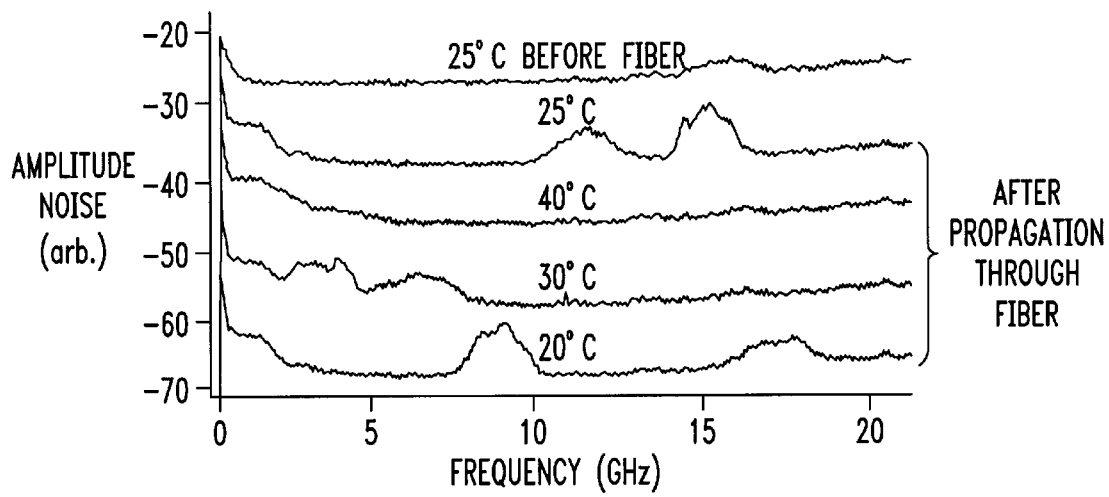
FIG. 5 contains plots of amplitude noise of the FP lasers associated with FIG. 3, before propagation through a transmission fiber at a temperature of 25° C. for both lasers, and after propagation through 20 km of TrueWave Minus® fiber at temperatures of 20°, 25°, 30° and 40° C. for one FP laser, the other held at 25° C. to provide an offset in their center wavelengths.

FIG. 5 contains a plot (labeled "A") of the amplitude noise from the same two FP lasers, the amplitude noise measured, at a laser temperature of 25° C. as in FIG. 3, before propagating through a significant length of fiber. It is evident that this plot is free of any noise spikes. This is the case since the semiconductor pumps have been polarization multiplexed, and the orthogonal light beams will not interfere with each other. Also shown in FIG. 5 are plots of the amplitude noise after propagation through 20 km of TrueWave Minus® fiber with both FP lasers having a temperature of 25° C. (plot B), and the one FP laser held at 25° C., with the other FP laser at temperatures of 20, 30 and 40° C., respectively (plots C, D and E, respectively). In each instance, there are noise spikes after propagation through the fiber, where the frequency of the spikes varies with the temperature of the FP lasers. These noise spikes are caused by the mixing of polarization components as they propagate through the optical fiber. The frequencies of the spikes will vary with temperature, due to the shifting of the laser mode frequencies with temperature. As with the mode spacing discussed above, the movement of these noise spikes with temperature is a heretofore undisclosed phenomenon. It is also to be noted that mode-partitioning noise, as discussed above with FIG. 2, is also present in the plots as shown in FIG. 5 after propagation through the transmission fiber.

Figure 6:
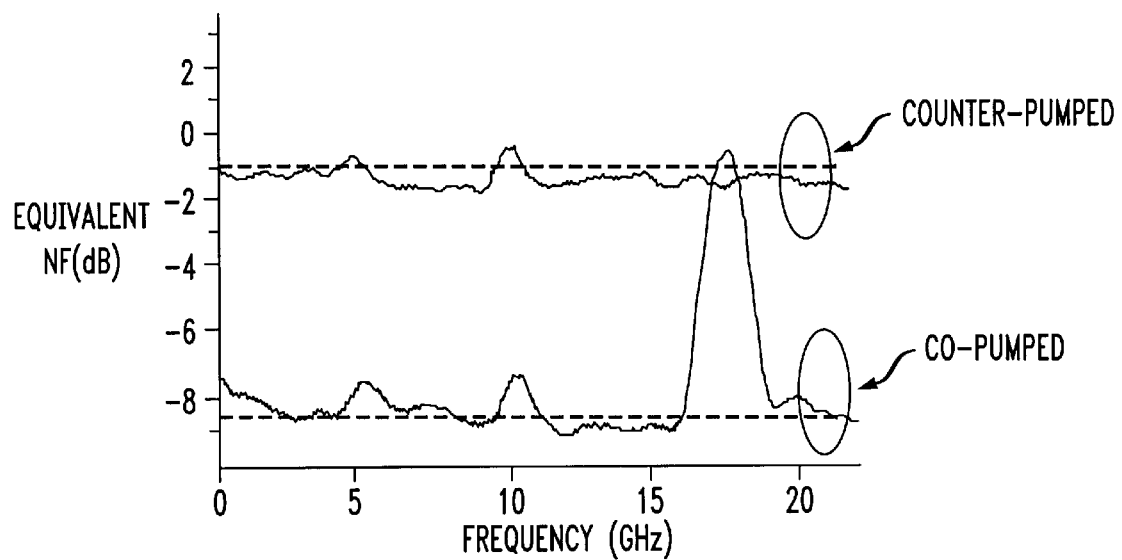
FIG. 6 contains plots of the electrical effective noise figure spectra of distributed Raman amplifiers pumped with the FP semiconductor pump lasers of FIG. 3, where the solid lines are associated with measured values and dashed lines with calculated values.

FIG. 6 contains plots of the electrical effective noise figure spectra of distributed Raman amplifiers pumped with the conventional FP semiconductor pump lasers whose spectra are plotted in FIG. 3. Data is shown for both a co- and counter-pumped amplifier. A pump power of 260 mW was used to generate the spectra of FIG. 6, generating an on/off Raman gain of 12.3 dB. The solid lines are experimentally measured values, while the dashed lines are theoretical values. The theoretical values were calculated based only on noise from signal-spontaneous beating; that is, excluding all "excess" noise sources that are the subject of this invention. It is to be noted that good agreement is found between the measured noise figure and the theoretical noise figure in the counter-propagating geometry, indicating that again the counter-propagating geometry has eliminated any "excess" noise features. In the co-propagating geometry, however, an extremely large noise spike at ~17 GHz is observed. This noise feature is due to mode beating among the longitudinal modes of the polarization multiplexed laser diodes, whose spectra are plotted in FIG. 3. Upon propagation, the polarization states of the two laser diodes are mixed, mode beating occurs and the resulting amplitude noise is transferred to the signal. It is important to note that this type of noise can appear above the "walk-off" frequency (5 GHz in this case) and it cannot be "averaged out" by fiber dispersion. This data illustrates the importance of configuring Raman pump sources for co-propagating Raman amplifiers in accordance with the present invention such that the frequency difference between all intense longitudinal modes of different, regardless of polarization, are separated by at least the electrical bandwidth of the communication system.

Figure 7:
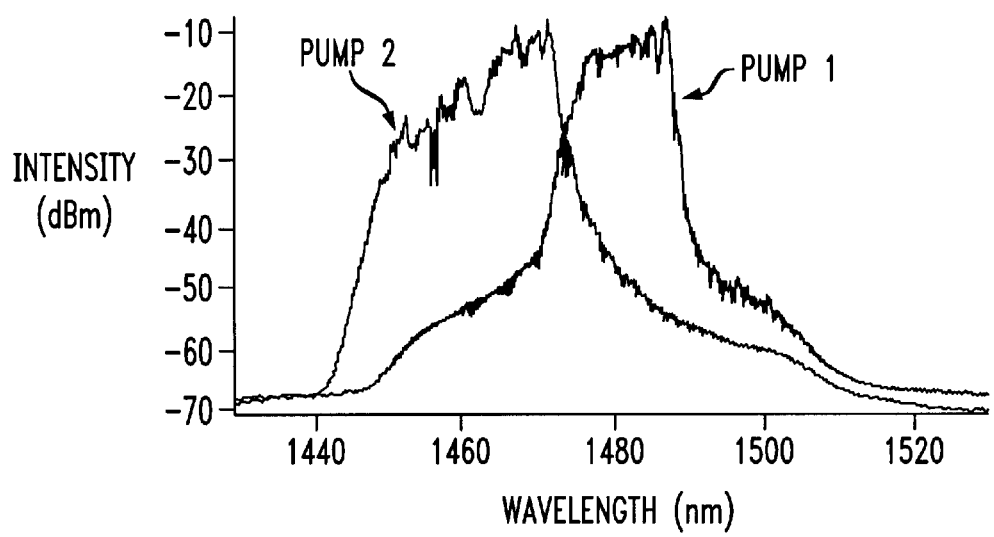
FIG. 7 contains plots of the optical spectra generated from the two FP semiconductor lasers of FIG. 3, with one pump maintained at a lower temperature to offset the two laser center wavelengths.
Figure 8:
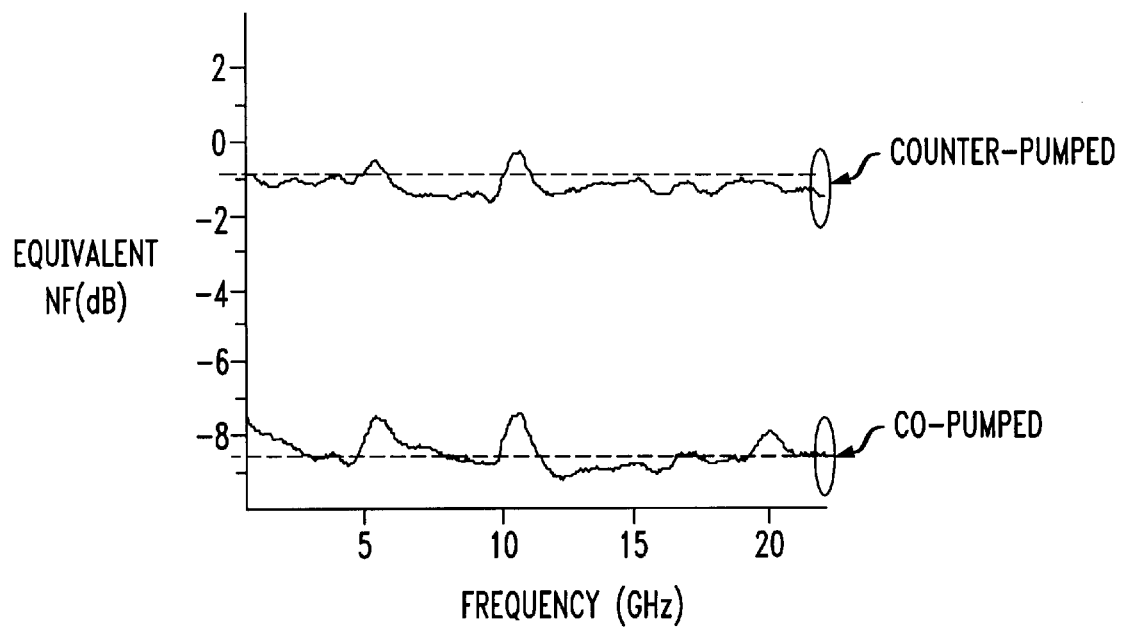
FIG. 8 contains plots of the electrical effective noise figure spectra of distributed Raman amplifiers pumped with the FP semiconductor lasers of FIG. 7, with the solid lines associated with experimentally measured values and the dashed lines associated with calculated values.

FIG. 7 contains plots of the optical spectra of the same lasers as used to generate FIG. 3, except that one pump has been temperature-tuned to a shorter wavelength. As shown, most of the intense longitudinal modes of the two lasers no longer overlap, although there remains some overlap of the modes at much lower intensities. FIG. 8 contains plots of the electrical effective noise figure spectra of distributed Raman amplifiers pumped with the FP semiconductor pump lasers whose spectra are plotted in FIG. 7. The data is shown for both a co- and a counter-pumped amplifier. A pump power of 260 mW was used, generating an on/off Raman gain of 12.3 dB. As before, the solid lines are associated with experimentally measured values and the dashed lines are associated with theoretical values. For the co-propagating pump geometry, good agreement is shown between the experimental and theoretical values. In comparing these results to those shown in FIG. 6, it is seen that the noise spike evident in FIG. 6 is essentially eliminated by temperature tuning the pumps such that the frequency difference between all intense longitudinal modes of the different lasers—regardless of polarization—are separated by an amount greater than the electrical bandwidth of the system (in this case, 22 GHz). It should be noted that temperature tuning is not essential for achieving this pump configuration. Semiconductor diodes with the appropriate wavelengths exhibiting off-set center wavelengths could be used.

Figure 9:
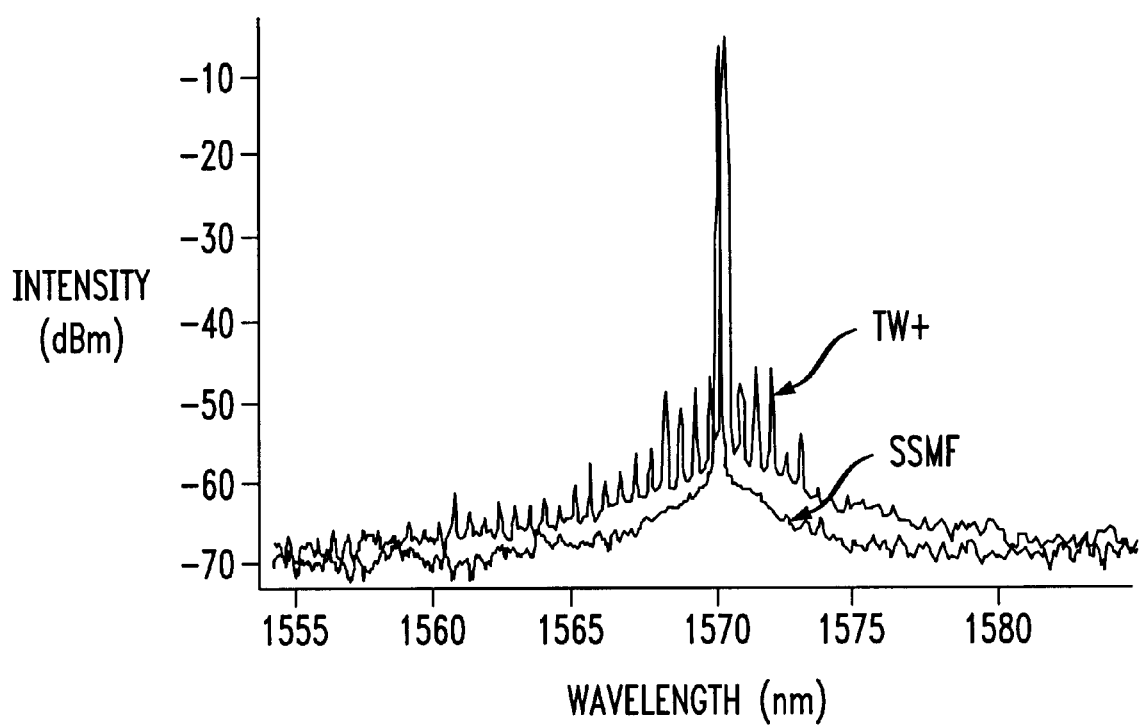
FIG. 9 contains plots of the optical spectra of an optical signal at a wavelength of 1570 nm that has been amplified by a co-propagating Raman pump at a wavelength of 1470 nm with a Raman gain of 4.5 dB in lengths of standard single mode fiber (SSMF) and TrueWave Plus® fiber.

FIG. 9 contains plots of the optical spectra of a signal at 1570 nm after it has co-propagated with a Raman pump at a wavelength of 1470 nm and experienced an on/off Raman gain of 4.5 dB. As shown, there are significant four-wave mixing sidebands generated by the mixing of the pump modes with the signal. The magnitude of the sidebands can be substantially reduced by the use of a single mode fiber, where the zero-dispersion wavelength $\lambda_0$ is near 1300 nm, rather than a fiber such as TrueWave Plus®, with a $\lambda_0$ that is nearly centered between the pump wavelength and the signal wavelength. It is to be noted that the difference in group velocity of the pump with respect to the signal can reduce the four-wave mixing efficiencies.

A number of different semiconductor pump sources could potentially meet the criteria outlined above for use in a co-propagating Raman amplifier. In accordance with the teachings of the present invention, an acceptable pump source for a co-propagating geometry is characterized by: (1) producing an output power of at least 50 mW; (2) having sufficient spectral width to suppress SBS; and (3) designed such that the frequency difference between all intense longitudinal modes of different lasers, regardless of polarization, are separated by at least the electrical bandwidth of the communication system, and that the frequency different between all intense longitudinal modes of one laser are separated by the walk-off frequency between the pump and the signals.

A frequency-dithered distributed feedback (DFB) laser can be modified, as described below, to exhibit the necessary attributes of a pump source for a co-propagating system geometry in accordance with the present invention. In particular, when used as a pump source in the co-propagating Raman amplifier, a conventional DFB laser is configured to produce a single longitudinal mode. One exemplary DFB laser that is useful in the co-propagating system of the present invention is disclosed in U.S. Pat. No. 5,111,475, "Analog Optical Fiber Communication System and Laser Adapted for Use in such a System, D. Ackerman et al, issued May 5, 1992, and assigned to the assignee of the present invention. In order to provide frequency dithering, a small-amplitude RF tone is added to the laser drive current, thus broadening the laser linewidth and suppressing the SBS. A suitable choice of the offset between the laser gain and the DFB wavelength will maximize the FM to AM efficiency; that is, the ratio of the amount of frequency to amplitude modulation induced by the RF tone. In accordance with the present invention, multiple frequency-dithered DFB lasers can be used as a co-propagating pump source, where the frequency spacing between adjacent DFB lasers needs to exceed the electrical bandwidth of the communication system. Additionally, pairs of DFBs can be modulated 180° out of phase such that the impact of any residual amplitude modulation is minimized.

Multimode DFB lasers are designed with the grating extending along a significant portion of the cavity length so that one (of only two possible) longitudinal modes satisfies the laser conditions on roundtrip gain and phase change at the laser's operating conditions. Decreasing the length of the grating region relative to the total cavity length, and positioning the grating toward the output facet of the laser, can allow several cavity modes near in wavelength to satisfy the lasing conditions simultaneously, achieving wavelength-stabilized multimode operation. It can be shown that a stabilized multimode spectrum from a DFB laser can increase the SBS threshold from a few milliwatts to greater than 120 milliwatts. The small ratio of grating length to total cavity length will also decrease the sensitivity of the laser's performance to the phase of the grating relative to the laser HR facet.

A distributed Bragg reflector (DBR) laser, like a DFB laser, uses a grating integrated into the laser cavity to control the laser wavelength. Unlike the DFB, however, the laser material above the grating in a DBR laser is biased separately from the rest of the laser cavity. This separate biasing allows the carrier density, and thus the index of refraction of the material incorporating the grating, to be controlled by the bias applied to the grating section of the laser. Since the stabilized wavelength of the laser is dependent on the "optical period" of the grating (i.e., the physical period multiplied by the index of refraction), the lasing wavelength can be controlled by the bias applied to this grating section. A selective area growth (SAG) may be used in the grating region to prevent this section from being absorbing at the designated lasing wavelength.

While a bias on the grating section can be used to adjust the lasing wavelength, any high frequency variation in this bias will broaden the linewidth of the output. The efficiency of the linewidth broadening can be two to three orders of magnitude greater than that of a standard DFB laser. The laser linewidth required for a co-propagating pump in accordance with the present invention may thus be obtained by adding noise to the bias signal to the grating section, rather than requiring a separate dithering circuit, as discussed above. One other alternative is to connect the grating section bias to the laser bias using an adjustable resistance element. The output wavelength can then be tuned to better match the desired target wavelength (by adjusting the resistance), while the Johnson noise from the resistor will provide the bias variation to broaden the laser linewidth.

As discussed above in association with the figures, simple Fabry-Perot (FP) lasers can be used as sources for a co-propagating Raman amplifier, with temperature-tuning applied to provide the desired frequency difference between all intense longitudinal modes. It should be noted that temperature tuning is not essential for achieving this pump configuration, since semiconductor diodes with separated center wavelengths at a given temperature could be used instead. Additionally, a pair of fiber Bragg gratings can be used to "lock" the wavelength of a simple FP laser. The pair of Bragg gratings are located approximately one meter from the semiconductor laser, while being sufficiently close to each other such that the mode spacing of the cavity created by the Bragg gratings is at least as large as the electrical bandwidth of the communication system. The Bragg grating located further from the semiconductor cavity is required to exhibit a reflectivity greater than that of the other Bragg grating.

Typically, the lowest (or nearly lowest) signal powers are present in a communication system at the point where the signals exit the transmission fiber and enter a discrete optical amplifier. It is common for the signals to be amplified in the first stage of an erbium-doped fiber amplifier (EDFA), and then to pass through a length of dispersion-compensating fiber. In accordance with the present invention, it is contemplated to remove the first stage EDFA, instead directly injected the communication signals into the dispersion compensating fiber with a co-propagating Raman pump. The low signal powers and high dispersion slope of the dispersion compensating fiber make this location in a communication system an ideal point for the application of co-propagating Raman amplification. In addition, the properties of the dispersion-compensating fiber may be optimized for Raman gain, as well as their dispersion characteristics.

It should be noted that while the above-described sources are particularly well-suited for use as Raman pump sources in a co-propagating amplifier arrangement (either as a discrete Raman amplifier or a distributed Raman amplifier), they are equally applicable to a counter-propagating geometry, due to their high output power and wavelength stability. Further, these sources may be useful as sources in conventional erbium-doped fiber amplifier arrangements.

What is claimed is:

1. An article comprising an optical fiber Raman amplifier comprising an input port responsive to an optical signal to be amplified;

an output port for providing an exit path from said Raman amplifier for an amplified optical signal;

an optical fiber path for support Raman gain disposed between said input port and said output port; and a Raman pump source coupled to said input port with said optical signal to be amplified, said Raman pump source including at least one pump laser for providing an optical pump to co-propagate with said optical signal through said optical fiber path, said Raman pump source exhibiting a relatively high output power, relatively large spectral width, a frequency difference between all longitudinal modes of each pump laser being separated by at least the walk-off frequency between the pump laser frequency and the signal frequency, and all intense longitudinal modes between different pump lasers, if there is more than one pump laser, being separated by at least the electrical bandwidth of the communication system.

2. Article according to claim 1, wherein the optical pump comprises a power of greater than or equal to 50 mW.

3. Article according to claim 1, wherein the walk-off frequency is approximately 5 GHz.

4. Article according to claim 1, wherein the walk-off frequency is approximately 1 GHz.

5. Article according to claim 1, wherein the intense longitudinal mode is defined as a mode having sufficient intensity to generate substantial Raman gain.

6. Article according to claim 5 wherein each intense longitudinal mode exhibits at least 10 dB more power than the remaining modes.

7. Article according to claim 1 wherein the Raman pump source comprises a single mode distributed feedback (DFB) laser with an additional RF tone for increasing the spectral bandwidth of the output from said single mode DFB laser.

8. Article according to claim 1, wherein the Raman pump source comprises at least two distributed feedback (DFB) single mode lasers, each comprising a different center frequency, with an RF tone added to each DFB laser to provide a relatively large spectral bandwidth and the frequency spacing between said at least two DFB lasers selected to exceed the system electrical bandwidth.

9. Article according to claim 8 wherein pairs of DFB lasers are modulated 180° out of phase to minimize amplitude modulation.

10. Article according to claim 1, wherein the Raman pump source comprises at least one multimode distributed feedback (DFB) laser.

11. Article according to claim 10, wherein the multimode DFB laser comprises a relatively short grating region, positioned near an output facet of said laser so as to allow for multimode modes of the optical signal to lase simultaneously.

12. Article according to claim 11 wherein the mode spacing between the intense longitudinal modes is greater than the walk-off frequency of pump and the signal in the Raman amplifier.

13. Article according to claim 10 wherein the Raman pump source comprises a pair of multimode DFB lasers, offset in wavelength to separate the mode beating frequency between DFB lasers by at least the electrical bandwidth of the system.

14. Article according to claim 1 wherein the Raman pump source comprises at least one distributed Bragg reflector (DBR) laser including a signal source applied to an area disposed above an included grating of said at least one DBR laser to broaden the spectral width of said at least one DBR laser.

15. Article according to claim 14 wherein the signal source comprises a high frequency signal source.

16. Article according to claim 14 wherein the signal source comprises a noise signal source.

17. Article according to claim 1 wherein the Raman pump source comprises at least one Fabry-Perot laser exhibiting a predetermined frequency separation, between all existing longitudinal modes, equal to at least the walk-off frequency between said at least one Fabry-Perot laser and the input optical signal.

18. Article according to claim 17 wherein the pump source comprises at least two Fabry-Perot lasers, each exhibiting a different center frequency, with a frequency difference between the intense longitudinal modes of different Fabry-Perot lasers being separated by at least the electrical bandwidth of the communication system.

19. Article according to claim 18 wherein the at least two Fabry-Perot lasers are temperature tuned to maintain a predetermined separation in center frequency between said at least two Fabry-Perot lasers.

20. Article according to claim 17 wherein the at least one Fabry-Perot laser further comprises a pair of external fiber Bragg gratings to generate a mode spacing between the at least one Fabry-Perot pump frequency and the input optical signal frequency, the mode spacing being at least equal to the walk-off frequency between said pump frequency and said input optical signal frequency.

21. Article according to claim 1 wherein the optical fiber path comprises dispersion compensating fiber, the optical signal and Raman pump source being coupled to said dispersion compensating fiber.

22. Article according to claim 21 wherein the Raman gain fiber exhibits a lower dispersion slope at the pump wavelength to reduce mode partitioning noise when utilized with multi-longitudinal mode pump lasers.

23. Article according to claim 22 wherein the dispersion slope is less than 5 ps/nm km at the pump wavelength.

24. Article according to clam 1, wherein the optical fiber path is selected such that the zero dispersion wavelength is not centered between the pump and signal wavelengths, the placement of the said zero dispersion wavelength for reducing pump-signal four wave mixing effects.

* * * * *